United States Patent [19]

Proskauer et al.

[11] Patent Number: 5,673,272
[45] Date of Patent: Sep. 30, 1997

[54] APPARATUS AND METHOD FOR PERFORMING DIGITAL SIGNAL PROCESSING IN AN ELECTRONIC CIRCUIT TESTER

[75] Inventors: Daniel C. Proskauer, Newton; Mogens Ravn, Winchester; Kevin G. Hood, Waltham; Thomas G. Amann, Canton; Thomas B. Westbom, Wayland, all of Mass.

[73] Assignee: Teradyne, Inc., Boston, Mass.

[21] Appl. No.: 600,837

[22] Filed: Feb. 13, 1996

[51] Int. Cl.⁶ .................................................. G01R 31/28
[52] U.S. Cl. .................................... 371/22.1; 324/73.1
[58] Field of Search ............................. 371/22.1, 22.3, 371/27, 25.1; 324/73.1, 158 R, 162; 364/485, 486, 765, 763, 580; 395/183.04, 325, 842, 476, 416

[56] References Cited

U.S. PATENT DOCUMENTS

| | | | |
|---|---|---|---|
| 4,994,732 | 2/1991 | Jeffrey et al. | 324/73.1 |
| 5,388,230 | 2/1995 | Yamada et al. | 395/325 |
| 5,422,892 | 6/1995 | Hii et al. | 371/24 |
| 5,479,415 | 12/1995 | Staiger | 371/27 |
| 5,487,154 | 1/1996 | Gunji | 395/842 |
| 5,541,862 | 7/1996 | Bright et al. | 364/580 |

OTHER PUBLICATIONS

Mercury Computer Systems, Inc., RACEway Interlink Modules, 1994, pp. 1–11.
Mercury Computer Systems, Inc., RACEway Interlink Modules (ILK4), 1993,pp. 1–4.

*Primary Examiner*—Robert W. Beausoliel, Jr.
*Assistant Examiner*—Nadeem Iqbal
*Attorney, Agent, or Firm*—Richard E. Gamache

[57] ABSTRACT

An electronic circuit tester for performing digital signal processing on signals generated by an electronic circuit including a multi-processor test computer, a plurality of driver/receiver channels, a plurality of capture instruments, and a plurality of high speed data paths. Capture instruments are programmed by the tester to sample a signal generated by an electronic circuit under test, convert the samples to digital form if necessary, and store the data samples in memory. The data samples are then moved from the memory of the capture instruments to the main memory of the multi-processor for analysis using digital signal processing techniques. After the initial group of data samples are moved from the capture instruments to main memory, subsequent programming of capture instruments and sampling of signals are performed concurrently with the movement and analysis of data samples. Multiple processors and multiple high speed data paths are preferably used to optimize test program throughput.

21 Claims, 8 Drawing Sheets

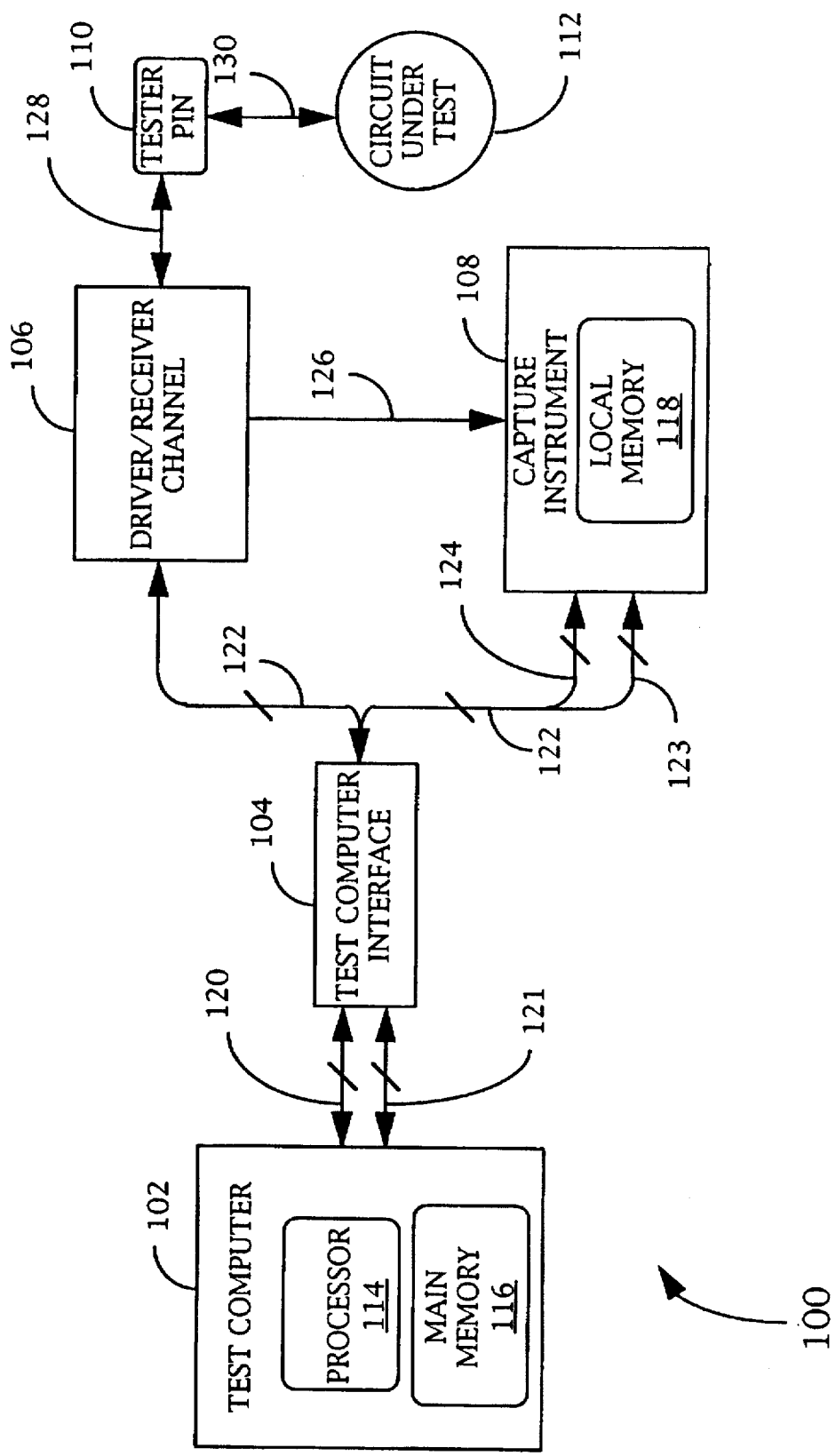
FIG. 1A - PRIOR ART

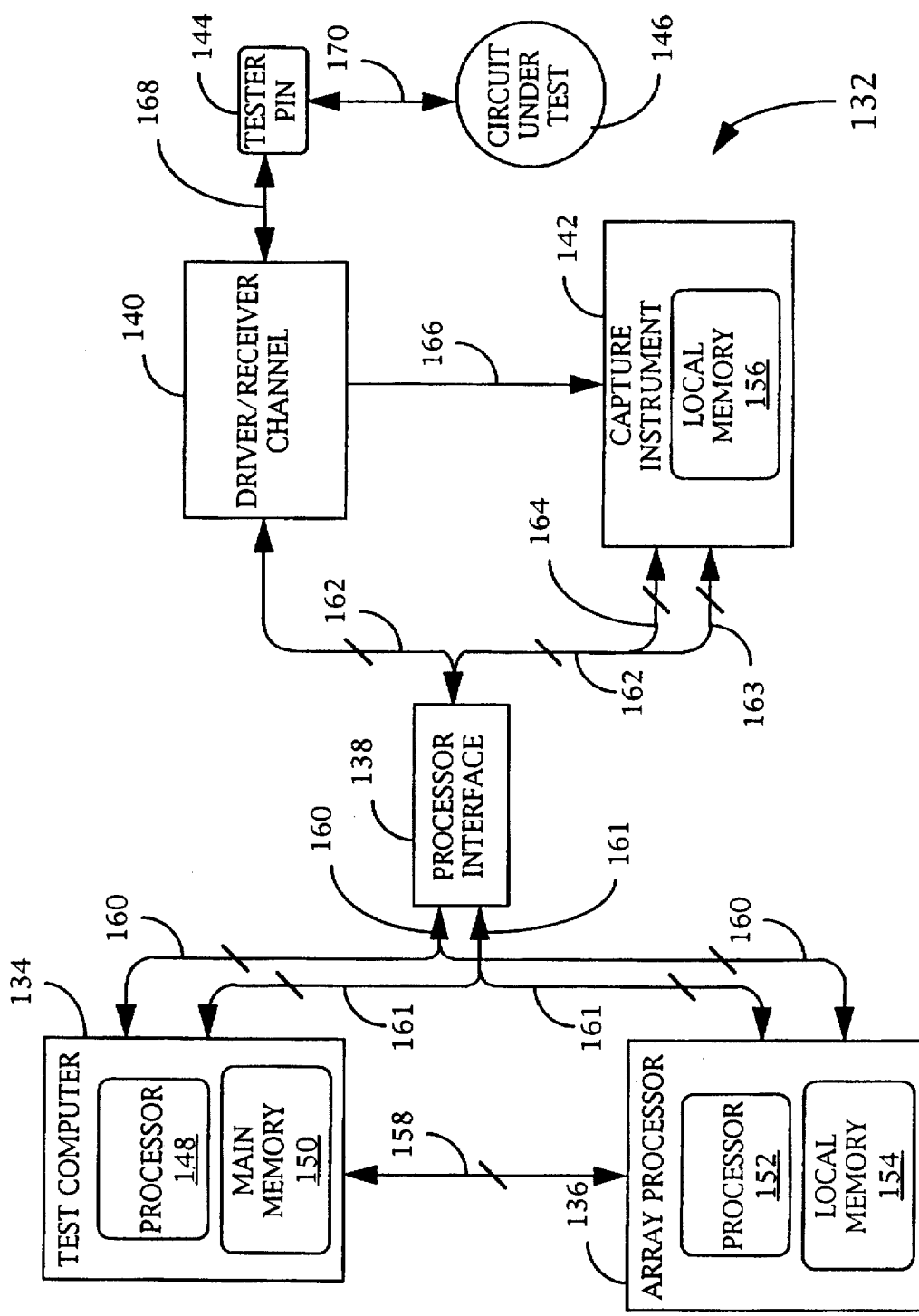
FIG. 1B - PRIOR ART

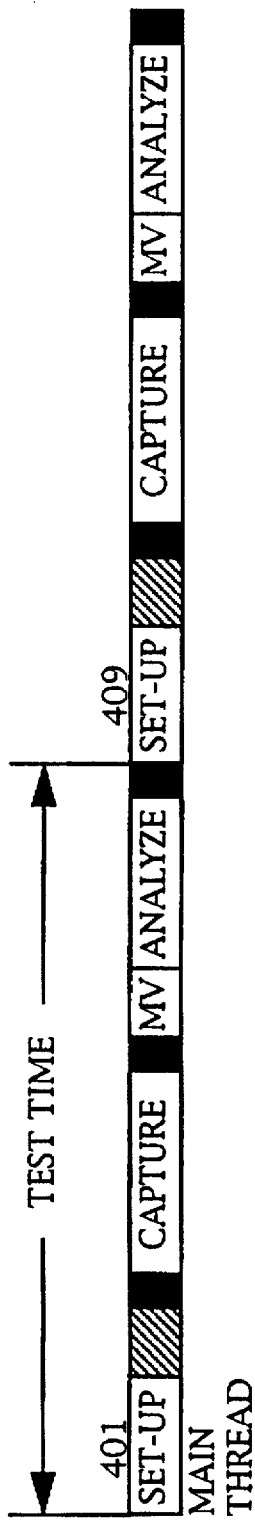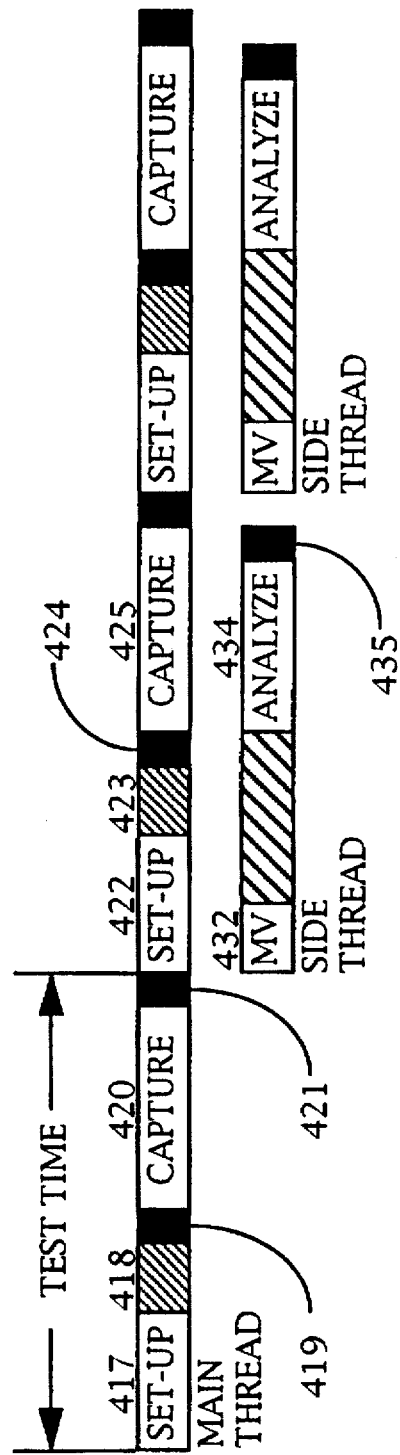

APPARATUS AND METHOD FOR PERFORMING DIGITAL SIGNAL PROCESSING IN AN ELECTRONIC CIRCUIT TESTER

BACKGROUND OF THE INVENTION

This invention relates generally to automatic test equipment, and more particularly to automatic test equipment for performing digital signal processing on signals generated by an electronic circuit.

Automatic test equipment (testers) is commonly used by manufacturers of semiconductor devices to determine whether the electronic circuits on the devices contain manufacturing defects. In general, a tester has computerized control circuitry (test computer), data acquisition circuitry (capture instrument), numerous driver/receiver channels, and numerous tester pins.

Each tester pin connects a driver/receiver channel to an electrical node of a circuit under test (CUT). Further, the driver/receiver channels are coupled to capture instruments which periodically sample signals generated by the CUT. The capture instruments either capture digital data produced by the CUT, or convert the data samples from analog to digital form so that the test computer may more easily perform data processing operations.

Testers operate by executing test programs. A typical test program includes numerous test functions that direct the tester to perform various operations such as set-up the tester, apply a test signal to a node of the CUT, sample an output signal at another node of the CUT, move sampled data from the local memory of the capture instrument to the main memory of the test computer, analyze the data, and execute the test statement. The test statement generally includes comparing the test results to specified limits, and dataloging and binning the test results.

Testers commonly analyze the sampled data provided by capture instruments using digital signal processing (DSP) techniques. Further, testers generally use DSP techniques to perform sine wave analysis, multi-tone analysis, pulse analysis, ramp analysis, video analysis, digital communications analysis, digital filtering, decoding, instrument calibration, and sine wave generation.

FIG. 1A shows a block diagram of prior art tester 100, such as the model A580 tester, sold by Teradyne, Inc., Boston, Mass., USA. In a typical mode of operation, test computer 102 executes a test program and sends control signals to driver/receiver channel 106 and capture instrument 108 through test computer interface 104. The control signals may direct driver/receiver channel 106 to receive an output signal generated by CUT 112 through tester pin 110, and to send the signal to capture instrument 108 on line 126. Further, the control signals may direct capture instrument 108 to sample the signal, convert the data samples to digital form if necessary, and store the samples in local memory 118.

Next, the test program may direct tester 100 to move the data samples from local memory 118 to main memory 116 so that processor 114 can analyze the data samples using DSP techniques. Test computer interface 104 receives the data samples from local memory 118 through internal bus 122, which includes data bus 123 and address and control bus 124. Like internal bus 122, test computer interface 104 also includes a data bus 120 and an address and control bus 121. Test computer interface 104 presents the data to main memory 116 using data bus 120, and address and control bus 121.

Further, processor 114 generally performs DSP operations using a standard DSP software library. In particular, the model A580 tester uses the DSP software library sold under the trademark "MATHADVANTAGE." Finally, processor 114 performs DSP analysis on a group of data while capture instrument 108 acquires data for a subsequent analysis.

Although tester 100 may be used to analyze data samples derived from an output signal generated by CUT 112, we have recognized that the data movement technique used by tester 100 yields testers which often do not have the desired operating speeds. For example, only data bus 120 is available to transfer the data samples from local memory 118 to main memory 116. Further, the rate at which data samples can be moved on data bus 120 is in the range of 1 MB/sec to 10 MB/sec. This data movement technique often results in a bottleneck to test program throughput.

FIG. 1B shows a block diagram of prior art tester 132, which is an alternate configuration of the model A580 tester. Data samples are placed in local memory 156 in a manner similar to that described for tester 100. However, if the test program directs tester 132 to perform DSP analysis, the data samples must be moved from local memory 156 to local memory 154, instead of to main memory 150. This is because tester 132 uses array processor 136 to perform the DSP analysis. Array processor 136 is optimized to perform DSP algorithms efficiently.

However, we have recognized that the data movement technique used by tester 132 also yields testers which often do not have the desired operating speeds. Like tester 100, only bus 160 is available to transfer the data samples from local memory 156 to local memory 154. Further, the rate at which data samples can be moved on bus 160 is in the range of 1 MB/sec to 10 MB/sec, and results in a bottleneck to test program throughput.

We have also recognized that the overhead required to synchronize the operation of test computer 134 and array processor 136 yields testers which often do not have the desired operating speeds. For example, test computer 134 must communicate with array processor 136 using system bus 158 to control the analysis of data samples and to obtain test results.

Although the techniques described above have been successfully used to perform DSP on data samples derived from output signals generated by a CUT, it would be desirable to have a tester that provides DSP functionality at faster operating speeds. It would also be desirable to have a tester that can be easily modified to add DSP functionality. Finally, it would be desirable to have a tester that supports test programs that are modular, maintainable, and portable.

SUMMARY OF THE INVENTION

With the foregoing background in mind, it is an object of the invention to provide a tester that can perform DSP analysis on data samples at state-of-the-art operating speeds.

Another object of the invention is to provide a tester that can be easily and inexpensively scaled to add broad DSP functionality.

Still another object of the invention is to provide a tester that supports test programs that are modular, maintainable, and portable.

The foregoing and other objects are achieved in an electronic circuit tester that includes a multi-processor test computer and at least one high speed data path.

In a preferred embodiment, the tester includes a multi-processor test computer having four processors, and four high speed data paths.

According to one feature of the invention, the test computer receives data samples from a plurality of capture instruments in parallel, and provides them to respective processors that analyze them in parallel using DSP techniques.

In a typical mode of operation, the tester directs a plurality of capture instruments to acquire distinct groups of data samples in their respective local memories. As each capture instrument finishes collecting a group of data samples in its local memory, the tester moves the data samples from the local memory of the capture instrument to the main memory of the test computer using one of a plurality of high speed data paths. The tester then directs a plurality of processors to perform DSP operations in parallel on the groups of data samples. While the plurality of processors are performing data processing on the groups of data samples, additional processors optionally program the plurality of capture instruments to acquire additional groups of data samples for subsequent DSP analyses.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1A is a block diagram of a prior art tester that is capable of performing DSP analysis, FIG. 1B is a block diagram of a prior art tester that includes circuitry that is optimized to execute DSP algorithms, FIG. 4A is a timing diagram for a prior art 1-processor system with no parallel processing, FIG. 4B is a timing diagram for a 1-processor system with parallel processing.

DESCRIPTION OF THE PREFERRED EMBODIMENT

Figure 2:
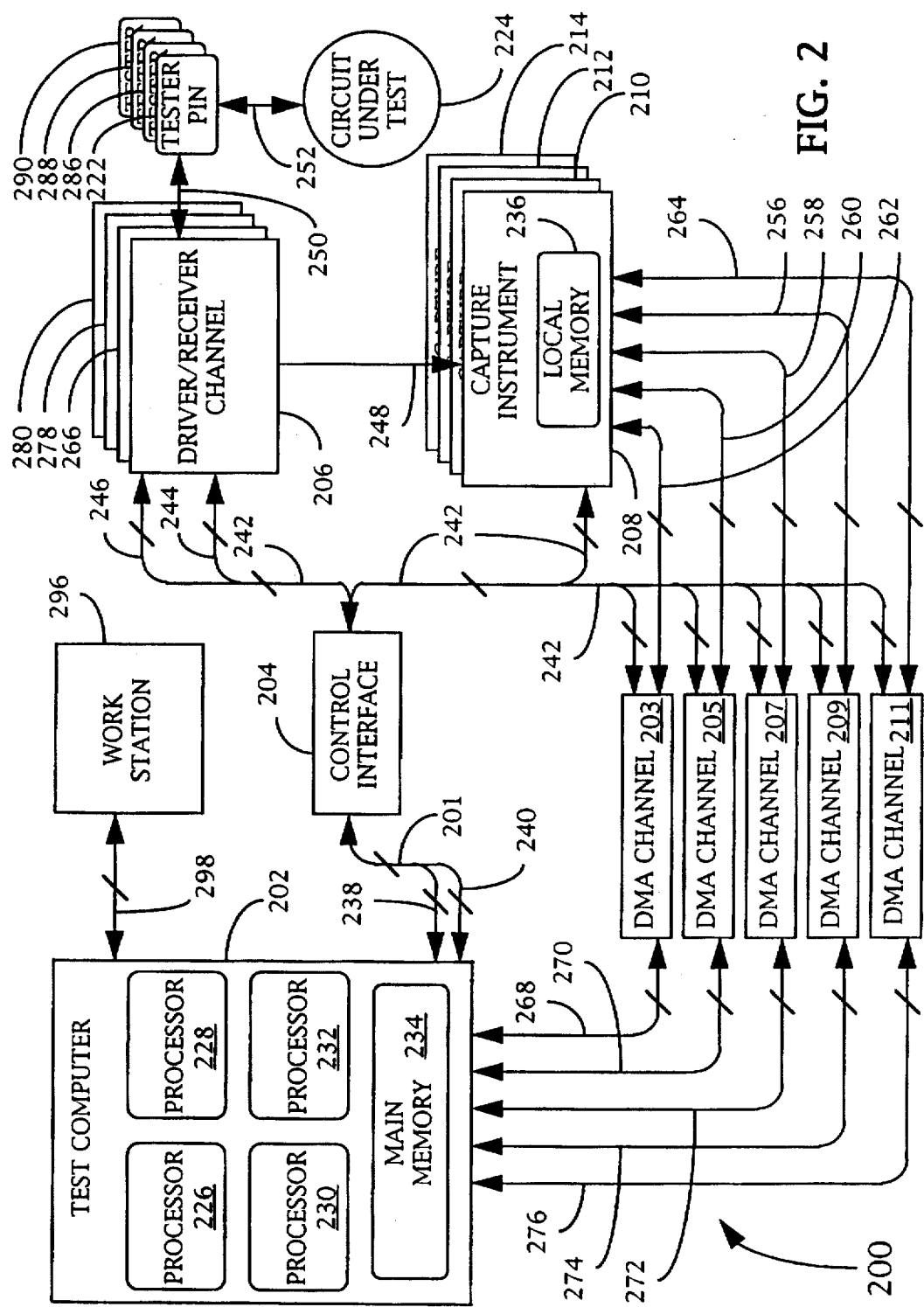
FIG. 2 is a block diagram of a configuration of the present invention that includes four processors and four high speed data paths.

FIG. 2 shows an embodiment of a tester that is capable of performing DSP on sampled data derived from output signals generated by an electronic circuit. The circuitry for tester 200 is normally enclosed in a tester body (not shown), comprised of an electronics cabinet and a test head. Interface hardware (not shown) such as a device interface board (DIB), probe interface board (PIB), or handler interface board (HIB), separates the tester body from CUT 224. The interface hardware includes numerous tester pins such as tester pins 222, 286, 288, and 290.

Typically, computer work station 296 controls tester 200. A test engineer develops test programs, which include numerous test functions, on work station 296. The test engineer then loads the test program into main memory 234 of test computer 202 using system bus 298. The test engineer may also enter commands for tester 200 at work station 296. For example, the test engineer may enter a command either to start a test or to specify certain operating parameters. Finally, tester 200 sends test results on system bus 298 to work station 296 which displays the results to the test engineer.

Tester 200 typically makes numerous connections to CUT 224. In particular, tester pins 222, 286, 288, and 290 are connected to different electrical nodes of CUT 224. In a typical application, a driver/receiver channel applies a test signal to a node of CUT 224 through a tester pin. Another driver/receiver channel then detects an output signal from a node of CUT 224 through another tester pin. The test program executed by tester 200 usually specifies the characteristics of both the test signals applied to CUT 224 and the output signals tester 200 expects to receive from CUT 224. Internal bus 242 connects control interface 204 to driver/receiver channels 206, 266, 278, and 280; capture instruments 208, 210, 212, and 214; and DMA channels 203, 205, 207, 209, and 211. Internal bus 242 includes data bus 244 and control bus 246. Control interface 204 buffers the data and control signals. Internal bus 201 connects test computer 202 to control interface 204. Internal bus 201 includes data bus 238 and control bus 240. Using internal busses 201 and 242, and control interface 204, test computer 202 sends programming and control signals to the driver/receiver channels, the capture instruments, and the DMA channels. In the preferred embodiment, test computer 202 sends programming and control signals at a minimum rate of 8 MB/sec.

In a typical mode of operation, test computer 202 sends commands through control interface 204 to both capture instrument 208 and driver/receiver channel 206 to program them for an upcoming test. For example, test computer 202 may program driver/receiver channel 206 to receive an output signal from CUT 224 through test pin 222, and then present the output signal to capture instrument 208 on line 248. Further, test computer 202 may program capture instrument 208 to sample a portion of the output signal, convert the samples from analog to digital form if necessary, and store the data samples in local memory 236.

Control bus 268 connects test computer 202 to DMA channel 203. Similarly, control bus 262 connects each capture instrument, in particular capture instrument 208, to DMA channel 203. Control bus 268 is typically used to access the registers of the capture instruments. In the preferred embodiment, control bus 268 is capable of accessing capture instrument data at a rate of at least 8 MB/sec.

High speed data busses 270, 272, 274, and 276 connect test computer 202 to DMA channels 205, 207, 209, and 211, respectively. Similarly, high speed data busses 260, 258, 256, and 264 connect each capture instrument, in particular capture instrument 208, to DMA channels 205, 207, 209, and 211, respectively. The DMA channels and high speed data busses are used to move data samples from the respective local memories of the capture instruments, in particular local memory 236, to main memory 234.

Each high speed data bus 260, 258, 256, and 264 is connected to a multiplexor (not shown) included in each capture instrument. As a result, a capture instrument may be programmed to select a specific high speed data bus for the movement of data samples from its local memory to main memory. In this way, a maximum of four different capture instruments may be programmed to move data samples on four different high speed data busses in parallel. The ability to move data samples across multiple data paths simultaneously constitutes a substantial advantage of the present invention.

The high speed data busses are capable of moving data samples from the respective local memories of the capture instruments to main memory 234 at a minimum rate of 15 MB/sec. In contrast, busses 120 and 160 of the prior art are capable of moving data samples at a rate within the range of 1 MB/sec to 10 MB/sec. The higher data rates of the high speed data busses, coupled with the ability to move data samples across multiple data paths simultaneously, substantially improves test program throughput.

One feature of the local memories of the capture instruments is that they are configured with dual ports (not shown). This means that if the data samples for a test require no more than one half of the memory locations of local memory 236, then the data samples may be moved out of local memory 236 while additional data samples are captured in the other half of local memory 236. Alternatively, if the data samples for a test require more than one half of the memory locations of local memory 236, then all of local memory 236 may be used as one memory. However, in this case, data samples may not be moved and captured simultaneously.

An additional feature of the capture instruments, in particular capture instrument 208, is that they may be programmed for an upcoming test while data samples are being moved from their respective local memories to main memory 234.

Test computer 202 is commonly called a multi-processing computer because it supports multiple processors under integrated control. FIG. 2 shows test computer 202 with four processors, namely processor 226, processor 228, processor 230, and processor 232. An important feature of test computer 202 is that processors 226, 228, 230, and 232 are capable of processing up to four portions of the same test program simultaneously. In particular, one processor may control the flow of the test program and the other processors may execute DSP functions on data samples. The ability of processors 226, 228, 230, and 232 to execute different portions of a test program in parallel substantially improves test program throughput.

In a preferred embodiment, the functions of processors 226, 228, 230, and 232 are each performed by a processor sold under the trademark "HYPERSPARC." Further, test computer 202 includes boards sold under the trademark "SPARC," which currently may be configured with up to four processors. Future versions of the boards are expected to include more processors. As a result, processors may be easily added to test computer 202 to provide broad DSP functionality.

A feature of the present invention is its ability to execute different portions of a test program in parallel. Operating systems designed for multi-processing systems, such as the operating system sold under the trademark "SOLARIS," permit the creation and execution of multiple processes, called "threads." The creation of threads is independent of the number of available processors in a tester. For example, if there are enough processors available, then all active threads can potentially be executed in parallel. Alternatively, if there are more active threads than available processors, then the threads will queue up and wait until a processor becomes available. FIG. 2 shows test computer 202 which includes four processors. As a result, a maximum of four threads may be executed in parallel.

The processing threads created by the present invention include one main thread and multiple side threads. The main thread is analogous to the single process executed by systems that have only one processor; for example, the main thread typically controls the flow of the test program. The main thread is created when the test program is first loaded, and remains in existence until the test program terminates.

The side threads are created when necessary by either the main thread or other side threads. In the preferred embodiment, the functions performed by a side thread include moving data samples from the local memory of a capture instrument to the main memory of the test computer, analyzing the data samples, and executing the test statements.

Figure 3:
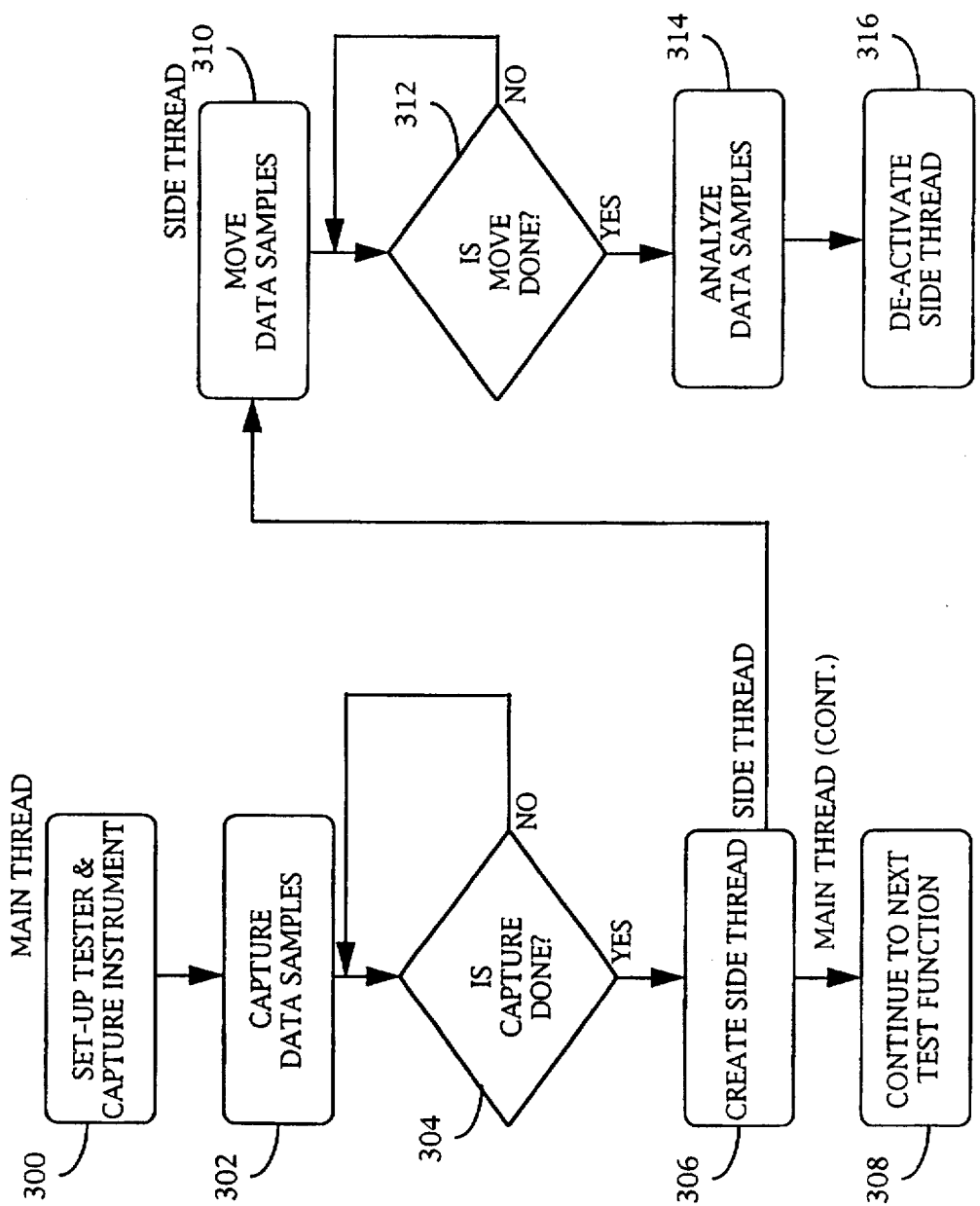
FIG. 3 is a flowchart of parallel processing, in accordance with the present invention.

The execution of a typical test function is performed in accordance with the procedures shown in FIG. 3. The tester is initialized in block 300 within the main thread. For example, a driver/receiver channel may be programmed to receive an output signal Generated by a CUT, and to send the signal to a capture instrument. Further, a capture instrument may be programmed to sample a portion of the signal, convert the samples from analog to digital form if necessary, store the data samples in local memory, and move the data samples from local memory to main memory using a specified high speed data bus.

Although FIG. 3 shows the main thread and one side thread, the preferred embodiment can potentially execute the main thread and up to three side threads in parallel. Further, the test engineer cannot predict the relative times at which the functions in each thread will be executed, nor can he predict which thread will complete first. For these reasons, the present invention has features that facilitate the simultaneous execution of multiple threads, thereby preventing the tester from producing erroneous test results.

One such feature is the creation and maintenance of multiple data array structures. A data array structure is a means of aggregating a group of data samples and other related information for a specific capture instrument. A typical data array structure resides in main memory and includes information fields for the data type (for example, real, complex, or integer), the sample size, the sampling rate, the state of the data (for example, "DATA NONE", "DATA CAPTURED", or "DATA READY"), and the location of the data (that is, the capture instrument that is assigned to the data array structure). Further, it includes the address of the region in main memory where the data samples will be stored for subsequent DSP analysis.

The advantages of using data array structures are twofold. First, the test computer can determine which capture instrument is set-up to acquire data samples simply by reading the "location of the data" field in the data array structure. Second, after the data samples have been moved from the capture instrument's local memory to main memory, the test computer can determine which capture instrument acquired the data samples, along with the test conditions, simply by reading the relevant information fields. A data array structure is assigned to a capture instrument when the capture instrument is set-up in block 300 of FIG. 3.

Data array structures are required at various times during the execution of a typical test program. For this reason, the present invention includes an efficient method of memory management for data array structures. At the start of a test program, a linear linked list of free data array structures is declared in main memory for storing data array structures that are not currently assigned to capture instruments. The list of free data array structures initially has no elements.

Three lists of data array pointers are also declared in main memory at the start of a test program. A data array pointer is merely an address of a data array structure in memory. The three lists correspond to the three types of scope that a data array structure can have. For example, the scope of a data array structure can be either local, global, or permanent. A local data array structure can only be accessed within a thread, whereas both global and permanent data array structures can potentially be accessed by all active threads. The local, global, and permanent lists of data array pointers initially have no elements. Further, the local, global, and permanent lists of data array pointers are stored as members of a structure of active data array pointers.

Whenever a data array structure is needed, the list of free data array structures is checked to determine whether there are any unused data array structures available. If the list of free data array structures is empty, then a data array structure is created in main memory. The data array structure is then added to either the local, global, or permanent list of data array pointers. Alternatively, if the list of free data array structures contains a data array structure, then the data array structure is removed from the head of the list and added to the appropriate list of data array pointers. Finally, when the data array structure is no longer needed, it is removed from the list of data array pointers and added to the list of free data array structures.

The method of memory management for data array structures has three advantages. First, if there are any unused data array structures in the list of free data array structures, then the test program will remove the data array structure from the list instead of allocating memory for a new data array structure. Eliminating the need to repeatedly allocate memory for data array structures improves test program execution time. Second, arranging the free data array structures in a linear linked list allows easy access to the unused data array structures. Finally, storing the local, global, and permanent lists of data array pointers as members of a structure allows the test program to locate quickly a specific active data array pointer.

For the procedures shown in FIG. 3, data samples are moved by the side thread from the capture instrument's local memory to the region in main memory referenced by the data array structure. In addition, the data samples associated with the data array structure are analyzed by the side thread. As a result, the scope of the data array structure that is assigned to the capture instrument in block 300 is local.

Another feature is the creation and maintenance of multiple test function information structures. Each test function has an associated test function information structure. A typical test function information structure resides in main memory and includes a counter for the number of active threads running in the test function, the total number of threads started for the test function, and a list of local data array structures.

The advantages of using test function information structures are that the test computer can easily determine what local data array structures are associated with the test function, and the test computer can easily limit the number of test functions that are allowed to run concurrently. During the set-up of the tester in block 300, a specific number of test function information structures are created. Further, the number of test function information structures remains constant throughout the execution of a test program.

A typical test program executes numerous test functions. For this reason, block 300 includes the creation, in main memory 234, of both a test function information "busy" queue and a test function information "free" queue. The busy queue and the free queue operate as linear linked lists. For example, after the test function information structures are created, they are attached to the free queue. When a test function is invoked, a test function information structure is removed from the free queue and attached to the busy queue. In this way, the test computer can determine which test function information structures are in use and which test function information structures are available.

Test function information structures can limit the number of test functions that are allowed to run concurrently as follows. Assume that two test function information structures are created in block 300. Consequently, two test function information structures are attached to the free queue. If a test function is invoked, then one test function information structure will be removed from the free queue and attached to the busy queue, thereby leaving one test function information structure on the free queue. If another test function is invoked before the other test function is completed, then the other test function information structure will be removed from the free queue and attached to the busy queue, thereby leaving no test function information structures on the free queue. If a third test function is invoked while the other two test functions are still being executed, then the test computer must delay the execution of the third test function until one of the prior test functions terminates. At this time, a test function information structure is removed from the busy queue and re-attached to the free queue. A test function information structure is now available for the execution of the third test function.

Another feature is the ability to move data samples from the local memories of different capture instruments to main memory in parallel using different high speed data busses. In the preferred embodiment, four high speed data busses are connected to each capture instrument. However, other embodiments may have either fewer or more high speed data busses connected to each capture instrument. Consequently, high speed data busses are assigned to each capture instrument in block 300 in accordance with the configuration of the embodiment.

Still another feature is the ability to poll a capture instrument to determine its current state. A typical capture instrument has the following states: CAPTURE TRIGGERED, CAPTURE IN PROGRESS, and CAPTURE DONE. A capture instrument is polled by repeatedly reading one of three locations in the local memory of the capture instrument, corresponding to either the CAPTURE TRIGGERED, CAPTURE IN PROGRESS, or CAPTURE DONE state. For example, the test computer can determine whether a capture instrument has been set-up for a test by reading the memory location corresponding to the CAPTURE TRIGGERED state. In a typical mode of operation, the test computer repeatedly reads the "CAPTURE TRIGGERED" location in the local memory of each capture instrument until the data in the location indicates that the capture instrument has been set-up. If the polling of the "CAPTURE TRIGGERED" location fails to yield the desired result within a reasonable period of time, then the test computer generates a time-out error.

Additionally, the test computer can determine whether there are data samples in the capture instrument's local memory, prior to starting the capture of a new set of data samples, by polling either the CAPTURE IN PROGRESS or CAPTURE DONE state. If the data in the corresponding memory location indicates that either a capture is in progress or a capture has been completed, then the main thread can wait for all side threads to finish before starting a new data capture. In this way, data samples from a previous test will not be overwritten inadvertently. The test computer polls each capture instrument to determine its current state in block 300.

The test computer sends a control signal to the capture instrument to start a data capture in block 302. As mentioned above, if there are data samples in the local memory, then the main thread can wait for all side threads to finish before starting the data capture. This will ensure that all data moves are completed prior to starting the new data capture. The main thread determines which capture instrument has been set-up by reading the "location of the data" information field in its associated data array structure. While the capture instrument is capturing data, the state of the capture instrument is CAPTURE IN PROGRESS.

Next, the main thread waits until the capture is completed in block 304. This is required to synchronize the movement of data samples with the main thread. The main thread polls the capture instrument until it returns CAPTURE DONE. At this time, the "state of the data" parameter in the corresponding data array is updated from DATA NONE to DATA CAPTURED.

Before creating the side thread in block 306, the main thread determines which high speed data busses assigned to the capture instrument are currently busy, and which high speed data busses are available for the movement of data. This is necessary because multiple capture instruments cannot simultaneously move data samples on the same high speed data bus. The test computer stores information in main memory indicating which high speed data busses are assigned to each capture instrument, and which high speed data busses are currently selected for the movement of data samples. After reading this information, the test computer sends control signals to the capture instrument indicating which high speed data bus to use. Further, the test computer initializes the DMA channel associated with the high speed data bus. Finally, the main thread creates a new side thread in block 306.

A feature of the present invention is that after the required data capture has been completed and the side thread has been created, the main thread begins executing the test program code immediately following the creation of the side thread. For example, the main thread begins executing the next test function in block 308. The main thread does not wait for the functions within the side thread to be executed. In this way, the main thread functions and the side thread functions may be executed in parallel, so long as there is a sufficient number of available processors.

Another feature for controlling the simultaneous execution of multiple threads is the creation and maintenance of multiple thread information structures. A typical thread information structure resides in main memory and includes thread-specific copies of global data, a thread active flag, a pointer to a test function information structure, and a buffer for passing arguments between threads.

Once a side thread is created in block 306, it begins executing its related test functions. During this time, the thread is in the active state. When the side thread completes all of its test functions, the thread enters the inactive state. As a result, the side thread exists from the time of its creation to the end of a test program.

A typical test program executes multiple side threads. For this reason, both a thread information "busy" queue and a thread information "free" queue are created in block 300. The busy queue and the free queue operate as linear linked lists. For example, after a side thread is created, a thread information structure is attached to the busy queue. When the side thread finishes executing its related test functions, the side thread becomes inactive, and the thread information structure is removed from the busy queue and attached to the free queue. In this way, the main thread can determine how many side threads are currently active. Whereas only a limited number of test function information structures are created in block 300, additional thread information structures are created whenever there are no available thread information structures attached to the free queue.

While the main thread begins executing the next test function in block 308, the side thread starts moving data samples from the local memory of a capture instrument to the main memory of the test computer in block 310 using an available high speed data bus. The side thread then polls the capture instrument in block 312 to determine whether the data movement is completed.

A typical capture instrument has the following additional state: MOVE COMPLETED. The capture instrument is polled by repeatedly reading a location in its local memory corresponding to the MOVE COMPLETED state. The side thread polls the capture instrument until it indicates that the data movement is completed. At this time, the "state of the data" field in the corresponding data array structure is updated from DATA CAPTURED to DATA READY.

After the data movement is completed, the remaining code in the side thread is executed in block 314. In particular, the test computer may analyze the data samples in a data array using DSP techniques. Prior to analyzing the data samples, the test computer reads the "state of the data" field to make certain that the state is DATA READY. Finally, the side thread enters the inactive state in block 316.

An important feature of the present invention is the ability to capture, move and analyze different groups of data samples in parallel. In a preferred embodiment, four capture instruments may be programmed for parallel testing in block 300 of FIG. 3. Further, the main thread may direct the four capture instruments to start sampling different output signals in parallel in block 302.

Next, the main thread polls each capture instrument in series until the captures are completed in block 304. After the first capture instrument returns CAPTURE DONE, the test computer updates the fields of its corresponding data array structure. Further, the test computer assigns a high speed data bus to the capture instrument, and sends control signals to the capture instrument and its assigned DMA channel to start the movement of data samples. Finally, a side thread is created in block 306 to move the data samples from the first capture instrument to main memory, and to perform DSP analysis on the data samples.

Blocks 304 and 306 are then repeated for the three remaining capture instruments. As a result, four side threads will be created to move data samples in parallel from the local memories of four capture instruments to four respective data arrays in main memory, using the four high speed data busses. The four side threads will also analyze the data samples in the four data arrays in parallel, so long as there are no synchronization problems between competing processors in the test computer.

In order to ensure that the code in a side thread may be executed independently from the code in the main thread, certain restrictions are placed upon the functions that may be included in a side thread. This is because the code in the main thread and the code in a side thread may be executed in parallel, and the test engineer cannot predict the relative times at which functions in each thread will be executed, nor can he predict which thread will complete first. The first restriction is that the tester may be set-up only within the main thread, not within a side thread. This prevents two or more threads from setting-up either a driver/receiver channel or a capture instrument simultaneously. The second restriction is that global data may be written only within the main thread, not within a side thread. Global data is information stored in main memory that can potentially be accessed by all threads created by a test program. This restriction prevents a side thread from writing global data at the same time that another thread is reading from the same memory location.

Further, in order to ensure that the test data and processors are synchronized, certain flags and other information are maintained during the execution of a test program. For example, fields for a "counting semaphore," a "mutually exclusive lock," and a list of local data arrays are included in the test function information structure. The counting semaphore keeps track of the number of threads in existence in the test function. In addition, the mutually exclusive lock prevents multiple threads from simultaneously updating either the counting semaphore or the list of data arrays. Finally, the main thread can use both the thread information "busy" and "free" queues to synchronize the execution of multiple threads by waiting for all side threads to finish before continuing to the next test function.

FIG. 4A and FIG. 4B show timing diagrams which demonstrate how the creation of multiple threads of control decreases test time, even in the case where the test computer has only one processor. FIG. 4A shows a timing diagram for a tester with one processor and an operating system that does not support multiple threads. As a result, the processor must perform the following test functions in series: the set-up of the tester and capture instruments, the capture of data samples, the movement of data samples from local to main memory, the analysis of the data samples, and the execution of test statements. The test time, which is the time from the beginning of the first set-up, block 401, to the beginning of the second set-up, block 409, is shown in FIG. 4A.

FIG. 4B shows a timing diagram for a tester that has an operating system that permits the creation of a main thread and multiple side threads of control. However, the test computer only has one processor. In a typical test, the test computer is required to set-up the tester and capture instruments, to initiate a capture, to initiate a movement of data samples, to analyze the data samples, and to execute any test statements. Alternatively, the test computer is not required to capture the data, nor is it required to move the data. Once the test computer initiates a capture, the capture instrument controls the sampling of the output signal, the converting from analog to digital form (if necessary), and the storing in local memory. Further, once the test computer initiates a data movement, a DMA channel controls the moving of the data samples from local memory of the capture instrument to the main memory of the test computer.

The test computer sets-up a capture instrument, waits for the capture instrument to settle, and starts a capture in blocks 417, 418, and 419, respectively, of the main thread. Next, the capture instrument captures the data, and indicates that the capture is done in blocks 420 and 421, respectively.

After the capture is done, the test computer initiates a data movement and creates the side thread in block 432.

Although the movement of data samples does not require the test computer's processor, the test computer is still required to poll the capture instrument to determine when the move is completed. However, if the test computer polls the capture instrument and finds that the move is not done, then the side thread yields to the main thread, thereby allowing it to perform the set-up in block 422. In effect, the main thread and the side thread are time sharing the test computer's processor in blocks 422 and 432.

When the move of block 432 is completed, the main thread uses the test computer's processor exclusively to complete the set-up in block 422, wait for the capture instrument in block 423, and start a capture in block 424. Although the capture of data samples does not require the test computer's processor, the test computer is still required to poll the capture instrument to determine when the capture is done. However, if the test computer polls the capture instrument and finds that the capture is not done, then the main thread yields to the side thread, thereby allowing it to perform the analysis in block 434, and the test statement execution in block 435. Once again, the main thread and the side thread are time sharing the test computer's processor in blocks 425, 434, and 435. Even though the number of threads is greater than the total number of available processors in the test computer, the functions in the main thread and the side thread are executed concurrently by time sharing the test computer's processor.

The test time, which is the time from the beginning of the first set-up, block 417, to the beginning of the second set-up, block 422, is shown in FIG. 4B. Even though both FIG. 4A and FIG. 4B show timing diagrams for test computers with only one processor, the test time depicted in FIG. 4B is shorter than the test time depicted in FIG. 4A. This is because the timing diagram of FIG. 4B is based upon a tester that has an operating system that supports multiple threads.

Figure 5A:
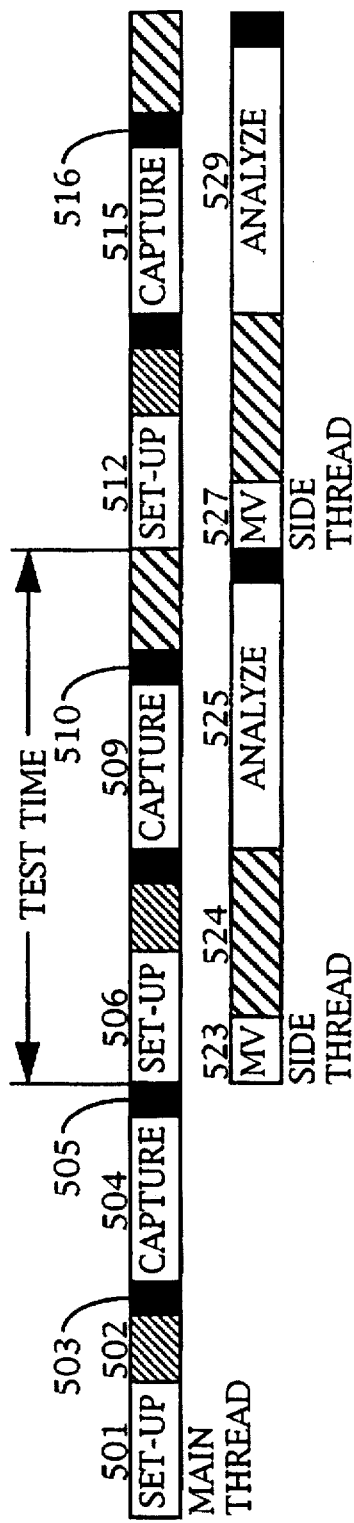
FIG. 5A is a timing diagram for a 1-processor system where the analyze time is greater than the capture time.
Figure 5B:
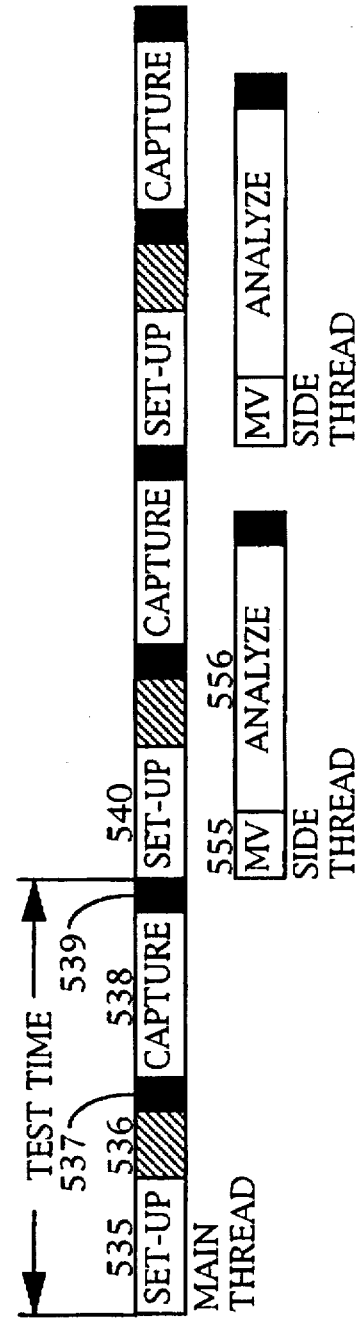
FIG. 5B is a timing diagram for a 2-processor system where the analyze time is greater than the capture time.

FIG. 5A and FIG. 5B show timing diagrams which demonstrate how the addition of processors to a multiprocessing test computer may improve test program throughput. FIG. 5A shows a timing diagram for a tester that has an operating system that supports multiple threads, but has only one processor. Further, FIG. 5A shows one main thread and three side threads. Because there are more active threads than available processors, the main thread and the side threads must time share the test computer's processor in blocks 506 and 523, blocks 509, 510 and 525, blocks 512 and 527, blocks 515, 516 and 529, blocks 518 and 531, and blocks 521, 522 and 533. As a result, the worst case test time depicted in FIG. 5A spans from the beginning of the second set-up, block 506, to the beginning of the third set-up, block 512.

FIG. 5B shows a timing diagram for the case where there is a main thread and three side threads. However, there are now two available processors instead of one. Blocks 535, 536, 537, 538, and 539 are executed in the same manner as blocks 501, 502, 503, 504, and 505. Further, the data movement of block 555 and the set-up of block 540 are executed concurrently in the same manner as blocks 506 and 523. However, whereas the first side thread of FIG. 5A waited in block 524 until there was a processor available to perform the analysis of block 525, the analysis of block 556 is performed immediately after the completion of the data movement in block 555. This is because in a test computer with two processors, one processor can execute the main thread while the other processor executes the side threads.

In FIG. 5B, test time is shown as the time from the beginning of the first set-up, block 535, to the beginning of the second set-up, block 540. Even though both FIG. 5A and FIG. 5B show timing diagrams for testers with operating systems that support multiple threads, the test time depicted in FIG. 5B is shorter than the test time depicted in FIG. 5A. This is because the timing diagram of FIG. 5B is based upon a test computer that has two available processors.

Figure 5C:
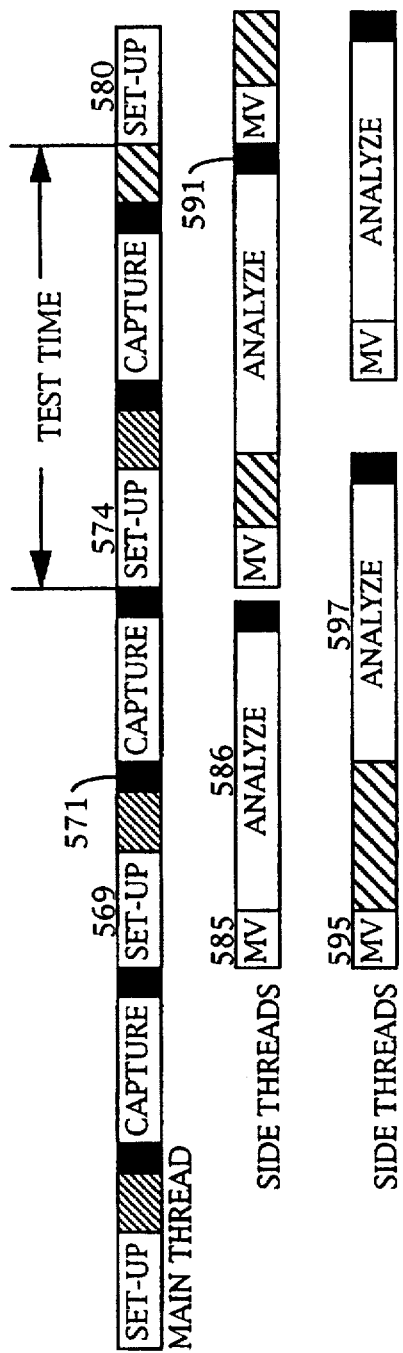
FIG. 5C is a timing diagram for a 2-processor system performing two DSP operations in parallel.

An important feature of the present invention is its ability to perform multiple DSP operations on different sets of data samples in parallel. FIG. 5C shows a timing diagram for a two processor system which performs two DSP operations in parallel. After the data captures are done, the two processors initiate two data movements and create two side threads in blocks 585 and 595. Because the movement of data does not require the test computer, the data movements in blocks 585 and 595, and the set-up in block 569 are performed concurrently. Further, when the move of block 595 is completed, the first DSP analysis is started in block 586 and is performed in parallel with the remaining operations of the set-up in block 569.

However, because there are only two available processors in the test computer, the DSP analysis of block 597 must wait until the capture is initiated in block 571 before it can begin operating on data samples. Nevertheless, portions of both the DSP analyses of block 586 and block 597 are performed in parallel. Further, the set-up in block 580 must wait until the test statement is executed in block 591 before it can program a capture instrument for an upcoming test. As a result, the worst case test time spans from the beginning of the third set-up, block 574, to the beginning of the fourth set-up, block 580.

Figure 5D:
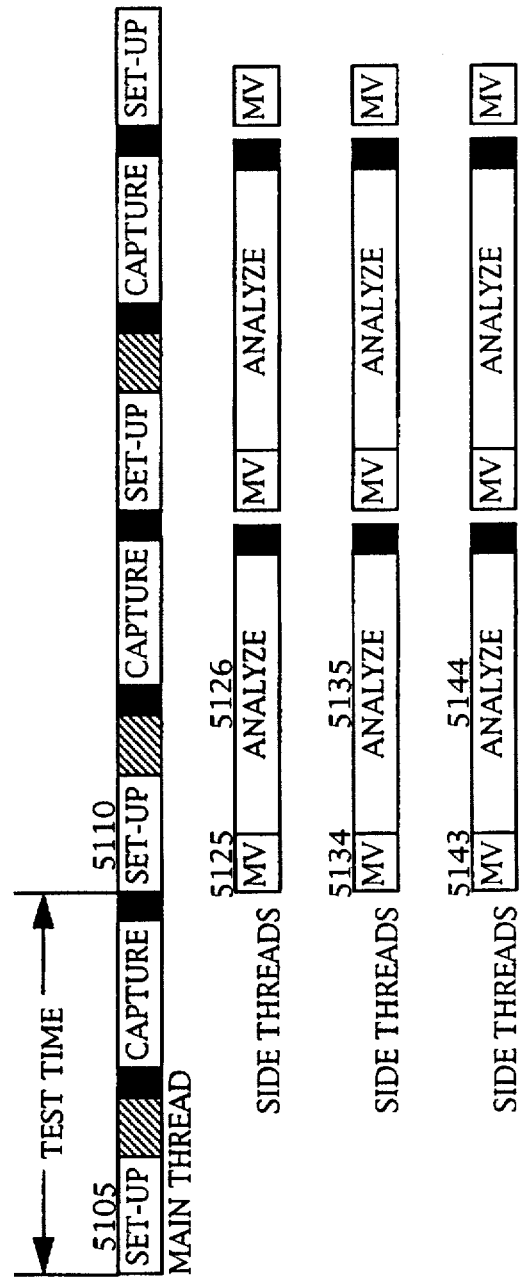
FIG. 5D is a timing diagram for a 4-processor system performing three DSP operations in parallel.

FIG. 5D shows a timing diagram for a test computer with four processors. After the captures are done, three processors initiate three data movements and create three side threads in blocks 5125, 5134, and 5143. Because the movement of data does not require the test computer, the data movements in blocks 5125, 5134, and 5143, and the set-up in block 5110 are performed in parallel. Further, when the moves of blocks 5125, 5134, and 5143 are completed, the DSP analyses are started in blocks 5126, 5135, and 5144, and are performed in parallel with the remaining operations of the set-up of block 5110. For this example, the test time spans from the beginning of the first set-up, block 5105, to the beginning of the second set-up, block 5110. Because there are a maximum of four active threads and there are four processors available, no thread is required to wait for a processor before executing the test functions contained within it. As a result, the test time depicted in FIG. 5D is shorter than the test time depicted in FIG. 5C.

FIG. 4A and FIG. 4B show timing diagrams which demonstrate how the creation of multiple threads of control improve test program throughput. Further, FIG. 5A and FIG. 5B show timing diagrams which demonstrate how the addition of processors to a multi-processing test computer may improve test program throughput. However, it should be noted that test program throughput may be affected by the time required to perform certain test functions. For example, test program throughput may be affected by the time required to perform a data capture, relative to the time required to perform a DSP analysis.

Additional processors generally improve test program throughput if the analyze time is greater than the capture time. Further, parallel processing generally improves test program throughput whether or not the analyze time is greater than the capture time. However, additional processors generally do not improve test program throughput if the capture time is greater than the analyze time.

Figure 6A:
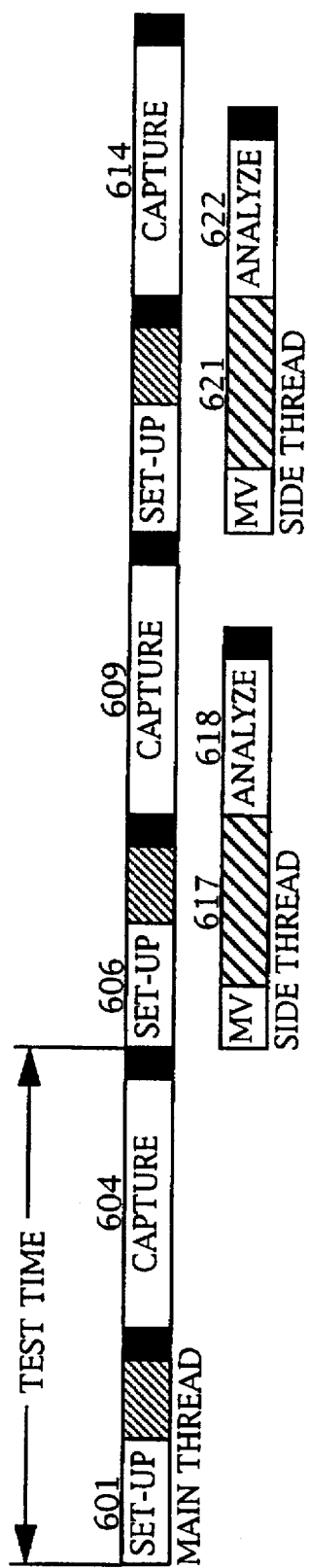
FIG. 6A is a timing diagram for a 1-processor system where the capture time is greater than the analyze time.
Figure 6B:
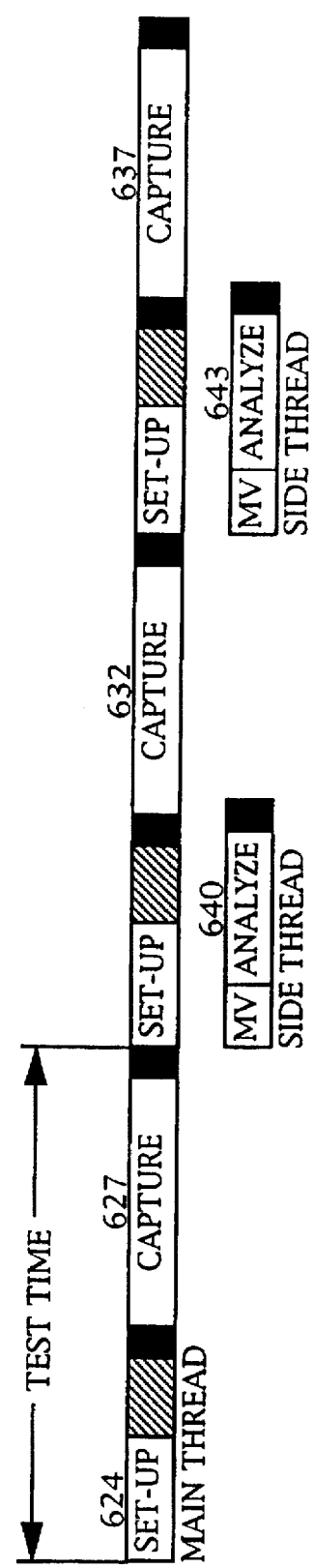
FIG. 6B is a timing diagram for a 2-processor system where the capture time is greater than the analyze time.

FIG. 6A and FIG. 6B show timing diagrams which demonstrate how the addition of processors to a multi-processing test computer does not improve test program throughput when the capture time is greater than the analyze time. FIG. 6A shows a timing diagram for a test computer with one processor where there are two threads active at once. Further, the capture times in blocks 604, 609, and 614 are longer than the analyze times in blocks 618 and 622. Because there are more active threads than available processors in the test computer, the side threads must wait for the processor in blocks 617 and 621 before performing the analyses in blocks 618 and 622. Finally, the test time spans from the beginning of the first set-up in block 601 to the beginning of the second set-up in block 606.

FIG. 6B shows a timing diagram for a test computer with two processors where there are two threads active at once. Once again, the capture times in blocks 627, 632, and 637 are longer than the analyze times in blocks 640 and 643. Because the number of active threads is equal to the number of available processors in the test computer, the side threads are not required to wait for a processor. Nevertheless, the test time depicted in FIG. 6B is equal to the test time depicted in FIG. 6A. Even though a processor was added to the test computer and the number of active threads remained the same, there was no improvement in test program throughput.

The present invention improves test program throughput by creating multiple threads of control, by executing multiple threads on multiple processors, and by transferring data samples from the capture instruments to the test computer along multiple high speed data paths. Although test conditions may be such that additional processors do not improve test program throughput, the existence of both multiple threads of control and multiple high speed data paths in the present invention still yields a tester with an operating speed that is faster than prior art testers.

Having described one embodiment of the invention, it will be apparent to one of skill in the art that various alternative embodiments could be formed. First, it should be noted that one of skill in the art could design a tester with different clock frequencies or with signals having different numbers of bits.

Also, it was described that tester 200 included four processors and four high speed data paths. However, one of skill in the art could design a tester with different numbers of processors and different numbers of high speed data paths.

Also, it was described that tester 200 included four driver/receiver channels and four capture instruments. However, one of skill in the art could design a tester with different numbers of driver/receiver channels and different numbers of capture instruments. Further, one of skill in the art could also design a tester with channels that perform only driver functions, only receiver functions, or both driver and receiver functions. It is not necessary for every channel in the tester to be capable of performing both driver and receiver functions.

Finally, the above description explained how the movement of data samples, the analysis of data samples, and the execution of test statements may be performed in a side thread, in parallel with the main thread that controls the flow of a test program. However, one of skill in the art could develop test programs that include different test functions in a side thread, so long as there are no synchronization problems between competing processors and other tester resources.

Therefore, the invention should be limited only by the spirit and scope of the appended claims.

What is claimed is:

1. A method of performing digital signal processing on data samples using a plurality of processors, used for testing an electronic circuit, comprising the steps of:
   (a) creating a main thread of control comprising the substeps of: (a1) initializing a plurality of capture instruments, (a2) operating the plurality of capture instruments to collect data samples in respective local memories, and (a3) repeating steps (a1) and (a2) after the data samples are moved from the respective local memories to a main memory in step (b1); and
   (b) creating a plurality of side threads of control, each side thread of control being created when one of the plurality of capture instruments has finished collecting data samples in a respective local memory in step (a2), each side thread of control comprising the substeps of:
      (b1) moving the data samples from the respective local memory to the main memory,
      (b2) analyzing the data samples in the main memory using digital signal processing techniques,
      (b3) saving analysis results in the main memory, and
      (b4) terminating the side thread of control,
   wherein a first processor executes the main thread of control, and
      wherein at least one remaining processor executes the plurality of side threads of control while the first processor executes the main thread, each side thread of control being executed when the at least one remaining processor becomes available.

2. The method as recited in claim 1, wherein the initializing in step (a1) comprises the substeps of:
   (i) selecting a sample size for each of the plurality of capture instruments,
   (ii) selecting a sampling rate for each of the plurality of capture instruments,
   (iii) assigning at least one high speed data bus to each of the plurality of capture instruments, and
   (iv) polling each of the plurality of capture instruments in series until each capture instrument indicates that it is ready to collect data samples.

3. The method as recited in claim 1, wherein the operating in step (a2) comprises the substeps of:
   (i) sending a first control signal to each of the plurality of capture instruments for starting the collection of data samples,
   (ii) polling each of the plurality of capture instruments in series until one of the capture instruments indicates that it has finished collecting data samples,
   (iii) sending a second control signal to the capture instrument that indicates that it has finished collecting data samples for starting the movement of the data samples from its local memory to the main memory, and
   (iv) repeating steps (ii) and (iii) until the second control signal is sent to each of the remaining capture instruments.

4. The method as recited in claim 2, wherein the moving in step (b1) comprises the substeps of:
   (i) determining which high speed data busses assigned to the one of the plurality of capture instruments are busy, and which busses are idle,
   (ii) selecting an idle high speed data bus,
   (iii) moving the data samples from the local memory of the one of the plurality of capture instruments to the main memory using the selected high speed data bus, and
   (iv) polling the one of the plurality of capture instruments until it indicates that the movement of data samples from its local memory to the main memory is complete.

5. The method as recited in claim 2, wherein the creating in step (a) further comprises the substeps of:
   (a4) creating in the main memory a first list including a plurality of elements, each element of the first list including sample information for the data samples collected in step (a2),
   (a5) creating in the main memory a local list, a global list, and a permanent list,
   (a6) creating in the main memory a second list including a plurality of elements, each element of the second list including thread data for one of the plurality of side threads of control created in step (b), and
   (a7) creating in main memory a third list.

6. The method as recited in claim 5,
   wherein the sample information includes a sample size, a sampling rate, and a pointer to a location in the main memory to which the data samples collected in step (a2) will be moved in step (b1).

7. The method as recited in claim 5,
   wherein the thread data includes thread-specific global data, a thread active flag, a pointer to one of the plurality of elements, and a buffer for passing arguments between a plurality of active threads.

8. The method as recited in claim 5, wherein the initializing in step (a1) further comprises the substeps of:
   (v) removing a first element from the first list,
   (vi) assigning the first element to one of the plurality of capture instruments,
   (vii) adding the first element to either the local list, the global list, or the permanent list, depending upon whether the scope of the data samples collected in step (a2) is local, global, or permanent, and
   (viii) repeating steps (v), (vi), and (vii) until each of the plurality of capture instruments has an element from the first list assigned to it.

9. The method as recited in claim 8,
   wherein the creating in step (b) further comprises the substeps of:
   (b5) removing a second element from the second list,
   (b6) assigning the second element to the thread,
   (b7) adding the second element to the third list, thereby indicating that the one of the plurality of side threads of control is active,
   (b8) the second element from the third list when the one of the plurality of side threads terminates,
   (b9) adding the second element to the second list, thereby indicating that the one of the plurality of side threads is inactive,
   (b10) removing the first element from either the local list, the global list, or the permanent list after the analysis results are saved in step (b3), and
   (b11) adding the first element to the first list, thereby indicating that the analysis of the data samples is complete.

10. The method as recited in claim 1, for operating automatic test equipment to perform digital signal processing on signals generated by an electronic circuit,
    wherein the creating in step (a) and the creating in step (b) are performed concurrently using a multi-processor test computer, and
    wherein the moving in step (b1) is performed using one of a plurality of high speed data busses.

11. An electronic circuit tester, having a plurality of test pins connected to a plurality of nodes on a circuit under test, for performing digital signal processing on electronic signals producedby the circuit under test, thereby determining whether the circuit under test is functioning properly, comprising:

(a) means for driving selected test pins;

(b) means for capturing a plurality of sets of data appearing on other selected test pins; and (c) multi-processor means connected to the driving means and the capturing means, having a first processor for executing a main thread of control and at least one remaining processor for executing a plurality of side threads of control, wherein the first processor executes the main thread for controlling the driving means and the capturing means, and wherein the at least one remaining processor executes the plurality of side threads while the first processor executes the main thread, for analyzing the captured sets of data using digital signal processing techniques, each side thread being executed when the at least one remaining processor becomes available.

12. The electronic circuit tester of claim 11, wherein the number of side threads of control equals the number of remaining processors, thereby allowing the main thread of control and each side thread of control to be executed simultaneously.

13. The electronic circuit tester of claim 11, wherein the main thread of control creates each side thread of control when a respective set of data is captured.

14. The electronic circuit tester of claim 11, further comprising:

(e) an internal bus connected to the driving means, the capturing means, and the multi-processor means, for carrying control signals between the driving means, the capturing means, and the multi-processor means; and (f) a plurality of high speed data busses connected between the capturing means and the multi-processor means, for carrying the plurality of sets of data from respective local memories in the capturing means to a main memory in the multi-processing means for subsequent analysis.

15. The electronic circuit tester of claim 14, wherein the first processor sequentially initializes the driving means and the capturing means, controls the driving means and the capturing means for receiving and sampling the electronic signals to produce the plurality of sets of data, and creates each side thread of control when a respective set of data is captured.

16. The electronic circuit tester of claim 15, wherein the at least one remaining processor sequentially controls the capturing means and the multi-processor means for moving the plurality of sets of data from the respective local memories to the main memory, and analyzes the plurality of sets of data using digital signal processing techniques.

17. The electronic circuit tester of claim 11, wherein the multi-processor means further includes control circuitry for scheduling and synchronizing the first processor and the at least one remaining processor.

18. The electronic circuit tester of claim 14, wherein each high speed data bus includes a DMA channel.

19. The electronic circuit tester of claim 14, wherein the capturing means includes at least one multiplexor for selecting one of the plurality of high speed data busses to carry each set of data from each respective local memory to the main memory.

20. The electronic circuit tester of claim 14, wherein each respective local memory is a dual-ported memory.

21. The electronic circuit tester of claim 20, wherein the dual-ported memory has a first port for storing a first set of data in the dual-ported memory, and a second port for moving a second set of data from the dual-ported memory to the main memory, whereby the storing and the moving are performed simultaneously.

* * * * *